United States Patent
Qureshi

[11] Patent Number: 6,041,426
[45] Date of Patent: *Mar. 21, 2000

[54] BUILT IN SELF TEST BIST FOR RAMS USING A JOHNSON COUNTER AS A SOURCE OF DATA

[75] Inventor: Fazal Ur Rehman Qureshi, San Jose, Calif.

[73] Assignee: National Semiconductor Corporation, Santa Clara, Calif.

[*] Notice: This patent is subject to a terminal disclaimer.

[21] Appl. No.: 08/957,262

[22] Filed: Oct. 24, 1997

Related U.S. Application Data

[63] Continuation-in-part of application No. 08/502,574, Jul. 14, 1995, Pat. No. 5,689,466, which is a continuation-in-part of application No. 08/418,499, Apr. 7, 1995, abandoned.

[51] Int. Cl.[7] .............................. G11C 29/00; G11C 7/00
[52] U.S. Cl. ......................... 714/719; 714/800; 714/758; 714/763; 365/201
[58] Field of Search ..................................... 714/719, 733, 714/734, 736, 768, 805, 800, 758, 763, 766, 773, 32, 48, 52, 42; 365/200, 201; 364/265.3, 266.3, 266.4, 944.92, 945.6

[56] References Cited

U.S. PATENT DOCUMENTS

| | | | |
|---|---|---|---|
| 4,061,908 | 12/1977 | de Jonge et al. | 235/302.3 |
| 5,271,015 | 12/1993 | Akiyama | 714/722 |
| 5,381,373 | 1/1995 | Ohsawa | 365/201 |
| 5,475,815 | 12/1995 | Byers et al. | 714/32 |
| 5,640,354 | 6/1997 | Jang et al. | 365/201 |
| 5,689,466 | 11/1997 | Quershi | 365/201 |
| 5,818,772 | 10/1998 | Kuge | 365/201 |

FOREIGN PATENT DOCUMENTS

| | | |
|---|---|---|
| 2 296 247 | 7/1976 | France . |
| WO 86/01036 | 2/1986 | WIPO . |
| WO 88/09554 | 12/1988 | WIPO . |

*Primary Examiner*—Trinh L. Tu
*Attorney, Agent, or Firm*—Limbach & Limbach LLP

[57] ABSTRACT

Data or its inverse, is written into a regular structure, such as a RAM, while stepping through the address range. The data is then read out and a determination is made as to success or failure. The scheme is based upon a Johnson counter being the source of the data, or its inverse. This style of counting has the unique property that, every time a "count" takes place, the parity associated with the Johnson counter output will "toggle," since only one bit is allowed to change. Reliance on this parity toggling determines possible failures.

1 Claim, 2 Drawing Sheets

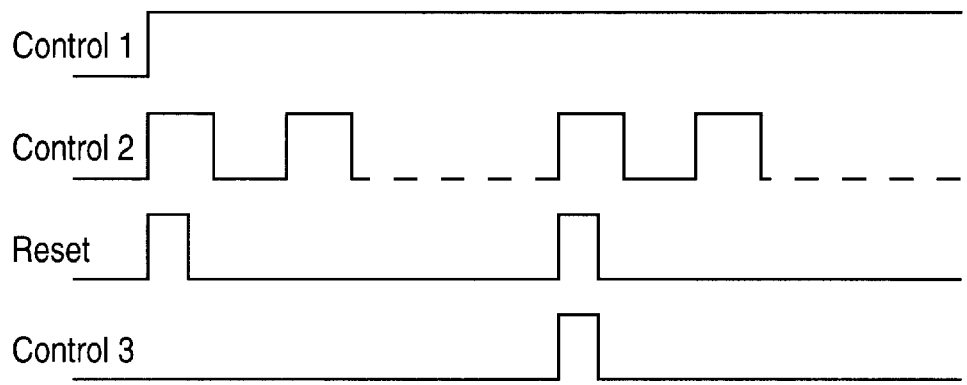
FIG. 2
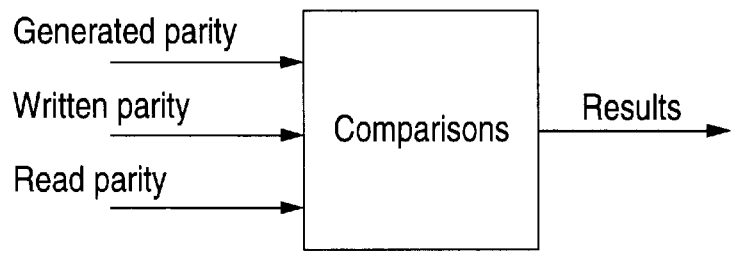
FIG. 3
| Address Location | Normal Data | Inverse Data | Fixed 0s or (1s) |
|---|---|---|---|
| 0 | 0000 | 1111 | 0000 or (1111) |
| 1 | 0001 | 1110 | 0000 or (1111) |
| 2 | 0011 | 1100 | 0000 or (1111) |
| 3 | 0111 | 1000 | 0000 or (1111) |
| 4 | 1111 | 0000 | 0000 or (1111) |
| 5 | 1110 | 0001 | 0000 or (1111) |
| 6 | 1100 | 0011 | 0000 or (1111) |
| 7 | 1000 | 0111 | 0000 or (1111) |
| 8 | 0000 | 1111 | 0000 or (1111) |
FIG. 4

BUILT IN SELF TEST BIST FOR RAMS USING A JOHNSON COUNTER AS A SOURCE OF DATA

RELATED APPLICATION

This is a Continuation-In-Part of application Ser. No. 08/502,574, filed Jul. 14, 1995, now U.S. Pat. No. 5,689,466 (Notice of Allowance mailed May 13, 1997), which is a Continuation-In-Part of application Ser. No. 08/418,499, filed on Apr. 7, 1995, now abandoned.

BACKGROUND OF THE INVENTION

1. Field of the Invention

The present invention relates to the testing of integrated circuits and, in particular, to a built in self test (BIST) technique for testing regular structures, e.g. random access memory (RAM) elements, using a Johnson counter as the source of data, or its inverse.

2. Discussion of the Relevant Art

In many integrated circuit technologies, a short between ground or the power supply and a signal line can cause the signal to be "stuck at" a fixed voltage level. Built in self test (BIST) is a circuit design technique in which elements of the circuit are used to test the circuit itself to identify, for example, stuck at faults.

Conventional BIST designs typically utilize relatively complex techniques for generating data and predicting failure, usually involving collection of a signature for analysis. Furthermore, most BIST designs do not provide for detection of multibit faults. Above-cited related application Ser. No. 08/502,574 discloses a BIST system in which multiple embedded RAMs are sequentially tested for stuck at faults, including multibit faults. Parity for the RAMs is also tested and marginal read/write problems are tested by changing clock frequency. A lockup mechanism yields the identity of the failed bits. A counter is utilized to iteratively cycle through the full address range of a RAM under test, performing write/read/compare operations. After one RAM has been tested, the counter increments to select another RAM for testing. This procedure is repeated until all on-chip RAMs have been tested.

In one embodiment of the system disclosed in application Ser. No. 08/502,574, the RAM write address is written as data and then read back. Since the address is written as data, the expected result is known. Thus, failures are predicted by comparing the reference address in a subsequent read operation with the data read from the RAM. The write/read/compare operation is then repeated by writing the inverse address as data through the full RAM address range. Through these two sets of operations, i.e., write address as data and inverse write address as data, every RAM bit is toggled. Marginal read/write problems can be tested by performing the two operations again at different frequencies. As stated above, after performing the two operations for one RAM, the procedure is repeated for each RAM until all have been tested.

In a second embodiment of the system disclosed in application Ser. No. 08/502,574, multiple embedded RAMs are tested simultaneously with the same address and data lines going to all RAMs. As with the first embodiment, testing is for stuck at faults, including multibit faults; parity for the RAMs is also tested, as are marginal read/write problems. The data patterns include the write address as data, inverse write address as data, or random data. Since all RAMs are tested simultaneously, the RAM select field of the counter is not needed.

Application Ser. No. 08/502,574, which is the subject of a Notice of Allowance dated May 13, 1997, is hereby incorporated by reference in its entirety.

The above-cited application discloses a system that relies on the address being written as data, or the inverse. A problem associated with this scheme is that the address counter output is, effectively both address and data. Thus, if the counter is broken, a false positive test result is generated.

SUMMARY

In accordance with the present invention, data or its inverse, is written into a regular structure, such as a RAM, while stepping through the address range. The data is then read out and a determination is made as to success or failure. The scheme is based upon a Johnson counter being the source of the data, or its inverse. This style of counting has the unique property that, every time a "count" takes place, the parity associated with the Johnson counter output will "toggle," since only one bit is allowed to change. Reliance on this parity toggling determines possible failures.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 2 is a timing diagram illustrating waveforms associated with operation of the FIG. 1 circuit.

FIG. 3 is a block diagram illustrating parity comparisons for the FIG. 1 circuit.

FIG. 4 is a table showing Johnson counter data output schemes for normal data, inverse data and all 0s/all 1s data.

DETAILED DESCRIPTION OF THE INVENTION

Figure 1:
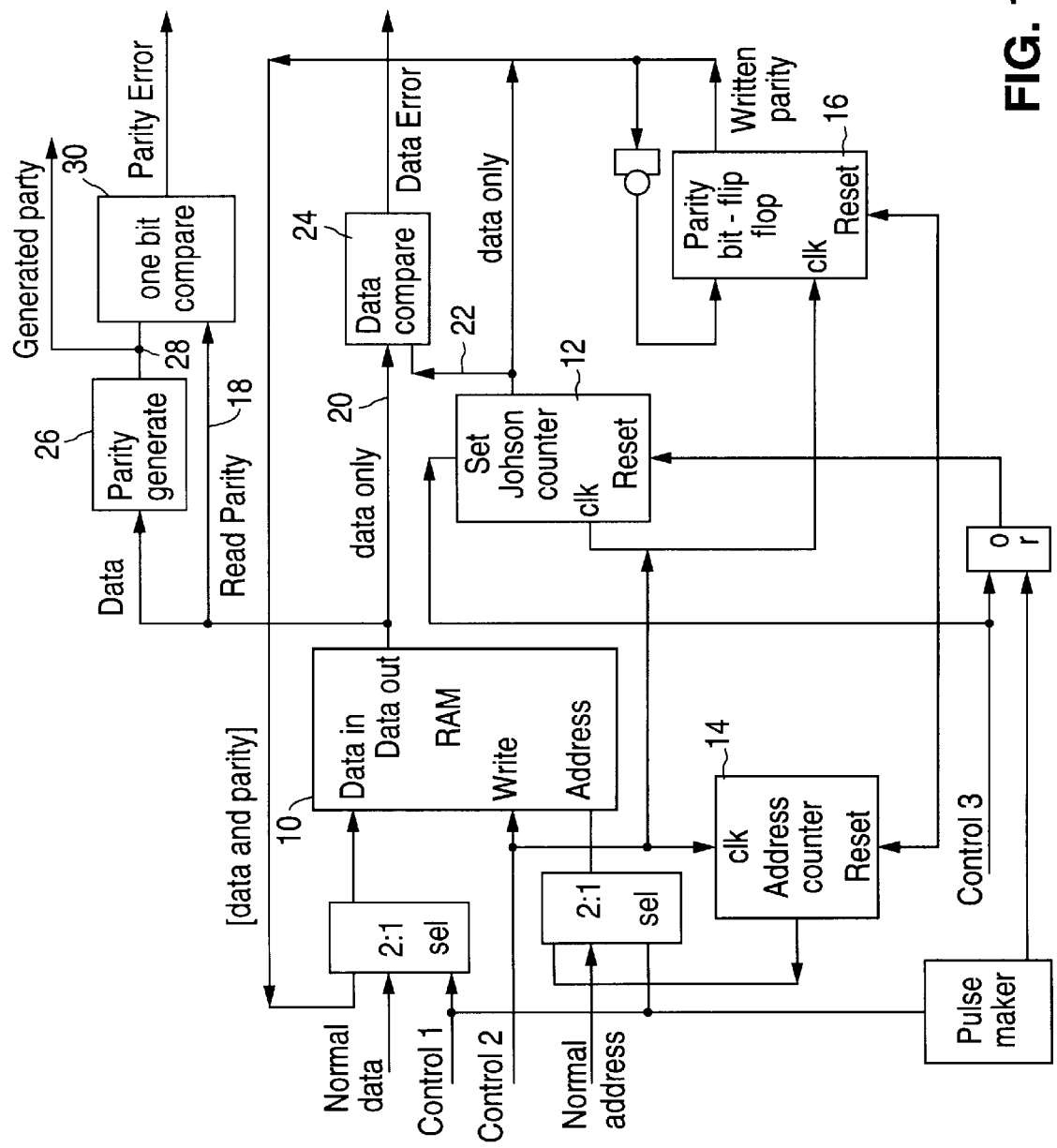
FIG. 1 is a block diagram illustrating a BIST circuit in accordance with the present invention.

A BIST system in accordance with the present invention will now be described in conjunction with FIG. 1 and its timing details, shown in FIG. 2.

As shown in FIG. 1, the entire address range of the RAM 10 is exercised by performing a test cycle at every address with normal data, i.e. control 3 signal non-active. This test sequence is followed by performing a test cycle at every address with inverted data; i.e. control 3 signal active performs the inversion. A test cycle is defined as a write operation followed by a read and compare operation. During a test cycle, the address remains the same and the Johnson counter 12 only changes at the beginning of the test cycle, i.e. every write time. As such, the written data is available for comparison purposes during read.

With reference to FIGS. 1 and 2, the following steps are taken to test the RAM 10. First, the rising edge of control 1 signal gives rise to a reset condition that initializes the address counter 14, the parity flip-flop 16 and the Johnson counter 12 and sets them all to zero. Those skilled in the art will appreciate that if a different set of starting conditions or a different parity arrangement is required, then set flip-flops or a combination of set and reset flip-flops can be used. Second, every time that control 2 signal goes high, the Johnson counter 12 is incremented, the address counter 14 is also incremented and the parity output bit 18 toggled. The Johnson counter output, along with the parity output bit, is provided as data into the RAM 10 at an address pointed to by the output of the address counter 14. When the control 2 signal goes low, the RAM 10 is read and its output 20 is compared to written data 22 from the Johnson counter 12 by data compare circuit 24. If there is no comparison fail, then the test progresses to the next address in sequence.

The RAM output data is also fed to a parity generation mechanism 26. The generated parity 28 is compared to the read parity by a one bit compare mechanism 30 to determine whether there is a parity error.

The written parity is also available for comparison purposes and can be used to determine if the parity or data is suspicious.

A test cycle is deemed to be a success only if there are no data and no parity errors:

No data error

This implies that the written data 22 and the read data 20 are the same; but, if the Johnson counter 12 is broken, then a false positive is provided.

No parity error This implies that the Johnson counter 12 is doing some sort of counting, since the parity would be changing between alternate addresses.

Parity error but no data error This implies that the parity bit is wrong.

Data error but no parity error This implies that the data bits are wrong.

Parity and data errors This is where the written parity comes into its own, since it will be available for comparison, in that it is compared to the generated parity to resolve matters further, i.e. when compared to both the read parity and generated parity, it is possible to determine which one is wrong etc. For example, as shown in FIG. 3, if the read and written parities are the same, i.e. generated parity is wrong, then the data is definitely corrupted.

Writing the inverse data is a very simple operation in that control 3 signal does a set on the Johnson counter 12 while a reset is done to the address counter 14 and the parity flip-flop 16. That is, the initial conditions are different in that the Johnson counter 12 now starts with all 1s. The rest of the sequence is identical to the normal data test sequence described above. This arrangement makes this a very cost effective solution.

As discussed above, the control 1 signal is produced for testing, i.e. it distinguishes between "normal" and test modes of operation, and stays up for the duration of the test. The rising edge of this signal is used to create a reset pulse. The control 2 signal is produced for a write operation, i.e. it distinguishes between "write" and read modes of operation, and stays high for one cycle only, cycle being write-read-compare. The rising edge of this signal is used for incrementing the address counter 14 and for "toggling" the parity bit; in each cycle, the address counter 14 is incremented and the parity bit toggled. The control 3 signal is produced for inverting the data, i.e. writing of inverse data. It acts like a reset, except for the Johnson counter 12, which gets set to an all 1 condition. 4 bit data width is assumed for this discussion.

Since written data is available for comparison, it would be very easy to accommodate random data as the basis for the testing sequence. The architecture will need modification and the parity concept will have to be modified in that a generated parity will have to be written. But this implementation is within the competency of a person of ordinary skill in the art.

An additional possibility of a test sequence, which would require additional control info., is that all 0s are written for the test sequence followed by all 1s. This will require a minor modification to the Johnson counter, a modification well within the competency of a person of ordinary skill in the art.

It should be understood that various alternatives to the embodiments of the invention described herein may be employed in practicing the invention. It is intended that the following claims define the scope of the invention and that methods and circuits within the scope of these claims and their equivalents be covered thereby.

What is claimed is:

1. A built in self test (BIST) method for testing an addressable circuit structure, the BIST method comprising:

providing a Johnson counter that provides its data output and its parity bit output as a data input to the addressable circuit structure;

initiating an address counter to count from zero to the full address range of the addressable circuit structure;

for each address provided by the address counter to the addressable memory structure, writing the data output and parity bit output from the Johnson counter to said address, reading the data and parity bit from said address, and comparing the data read from said address to the data and the parity bit read from the parity bit output of the Johnson counter; and written to said address in the event there is a mismatch between the read data and the written data or between the read parity bit and the parity bit output, generating an interrupt signal.

* * * * *

UNITED STATES PATENT AND TRADEMARK OFFICE
CERTIFICATE OF CORRECTION

PATENT NO. : 6,041,426
DATED : March 21, 2000
INVENTOR(S) : Fazal Ur Rehman Qureshi It is certified that error appears in the above-identified patent and that said Letters Patent is hereby corrected as shown below:

Column 4,
Line 41, after "to the data and the parity bit read from" insert -- said address to --.

Signed and Sealed this

Second Day of April, 2002

Attest:

JAMES E. ROGAN
*Attesting Officer*   *Director of the United States Patent and Trademark Office*